(12) United States Patent
Mizumura et al.

(10) Patent No.: US 7,522,006 B2
(45) Date of Patent: Apr. 21, 2009

(54) SURFACE MOUNT TYPE CRYSTAL OSCILLATOR

(75) Inventors: Hiroaki Mizumura, Sayama (JP); Kouichi Moriya, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 131 days.

(21) Appl. No.: 11/634,169

(22) Filed: Dec. 6, 2006

(65) Prior Publication Data

US 2007/0126519 A1 Jun. 7, 2007

(30) Foreign Application Priority Data

Dec. 7, 2005 (JP) .......................... 2005-353437

(51) Int. Cl.
*H03B 5/32* (2006.01)
*H03B 1/00* (2006.01)

(52) U.S. Cl. ..................... 331/158; 331/68; 331/108 D; 310/348

(58) Field of Classification Search ............... 331/68, 331/108 D, 158; 310/348
See application file for complete search history.

(56) References Cited

U.S. PATENT DOCUMENTS

| | | | |
|---|---|---|---|
| 6,229,404 B1 * | 5/2001 | Hatanaka | 331/68 |
| 6,587,008 B2 * | 7/2003 | Hatanaka et al. | 331/68 |
| 6,734,605 B2 * | 5/2004 | Kinoshita | 310/348 |
| 6,946,919 B2 * | 9/2005 | Knecht et al. | 331/36 C |
| 6,998,926 B2 * | 2/2006 | Miyazaki et al. | 331/68 |
| 7,135,810 B2 * | 11/2006 | Okajima | 310/348 |
| 2004/0070462 A1 * | 4/2004 | Alhayek et al. | 331/158 |

* cited by examiner

*Primary Examiner*—Robert Pascal
*Assistant Examiner*—Levi Gannon
(74) *Attorney, Agent, or Firm*—Fitch, Even, Tabin & Flannery

(57) ABSTRACT

A surface mount type crystal oscillator comprises: a package body comprised of laminated ceramic including a flat central layer made up of a first layer and a second layer, and a first and a second frame layer; a crystal blank hermetically sealed in a first recess defined by the first layer and the first frame layer; an IC chip placed in a second recess defined by the central layer and second frame layer; and a shield electrode disposed on a laminated surface of the second layer with the first layer. First and second electrode through-holes are formed through the first layer and second layer, respectively, for electrically connecting the crystal blank to the IC chip. The first and second electrode through-holes are positioned in areas outside the mounting position of the IC chip on the second recess.

5 Claims, 6 Drawing Sheets

SURFACE MOUNT TYPE CRYSTAL OSCILLATOR

This Application is a U.S. Utility Patent Application which claims foreign priority from Japanese Application No. 2005-353437, filed Dec. 7, 2005, the complete disclosure of which is incorporated herein by reference.

BACKGROUND OF THE INVENTION

1. Field of the Invention

The present invention relates to a quartz crystal oscillator which has a quartz crystal element and an IC chip having an oscillation circuit using the crystal element, both of which are contained in a surface mount package, and more particularly, to a crystal oscillator which uses a package body having an H-shaped cross-section with recesses in both main surfaces thereof and can securely connect an IC chip to the bottom surface of the recess.

2. Description of the Related Art

Surface mount type crystal oscillators are characterized by small size and light weight, and among others, temperature compensated crystal oscillators, which incorporate a temperature compensation mechanism for compensating a crystal element for frequency-temperature characteristics, are characterized by high frequency stability to variations in temperature. The surface mount type crystal oscillators are widely used as reference sources for frequency and time particularly in portable electronic devices including portable telephones and the like. In recent years, with an ever advancing reduction in size of surface mount type crystal oscillators, they are required to provide higher reliability.

FIG. 1A is a cross-sectional view illustrating an exemplary configuration of a conventional surface mount type crystal oscillator. The illustrated crystal oscillator comprises package body 1, quartz crystal blank 2, and IC (integrated circuit) chip 3. Package body 1 has a flat and substantially rectangular outer shape, and is formed with recesses in its top surface and bottom surface, respectively, resulting in an H-shaped cross section. Package body 1 is formed of laminated ceramic including flat and substantially rectangular central layer 1a, and upper and lower frame walls 1b, 1c each laminated to central layer 1a. Each frame layer 1b, 1c is formed in the shape of a frame which has a wall portion corresponding to an outer peripheral portion of central layer 1a, and an opening surrounded by the wall section. First recess 20a is formed by central layer 1a and upper frame layer 1b, as viewed in FIG. 1A, for receiving crystal blank 2 which functions as a crystal element. Second recess 20b is formed of central layer 1a and lower frame layer 1c, as viewed in FIG. 1A, for receiving IC chip 3 which contains the oscillation circuit and the like. Central layer 1a is comprised of first layer A, positioned on the upper side as viewed in FIG. 1A, and second layer B, positioned on the lower side as viewed in FIG. 1B, laminated on first layer A, thus causing the upper surface of first layer A to expose as the bottom surface of first recess 20a, and the lower surface of second layer B to expose as the bottom surface of second recess 20b.

At four corners on the outer bottom surface of package body 1, i.e., at four corners on the lower surface of frame layer 1c, mounting electrodes 10 are respectively formed for use in surface-mounting the crystal oscillator on a wiring board. These four mounting electrodes are used, for example, as a power supply terminal, a ground terminal, an output terminal in which an oscillation output appear, and an AFC terminal which is applied with an AFC (automatic frequency control) signal. Though not shown herein, each mounting electrode 10 is formed to partially extend to the outer side surface of package body 1. The part of mounting electrode 10 formed on the outer side surface of package body 1 is called a "side electrode." FIG. 1B is a bottom view of the crystal oscillator when IC chip 3 has not been mounted therein, better showing the positioning of mounting electrodes 10 and the bottom surface of second recess 20b.

A plurality of circuit terminals 9 are disposed on the bottom surface of second recess 20b, i.e., on the lower surface of second layer B so that the circuit terminals are arranged along both long sides of central layer 1a. Circuit terminals 9 are provided in correspondence to IC terminals, later described, associated with IC chip 3. In the illustrated crystal oscillator, four circuit terminals 9 are arranged in a line along each long side. Four of these circuit terminals are electrically connected to the aforementioned four mounting electrodes 10, respectively, through conductive paths, not shown, formed on the bottom surface of second recess 20b. A pair of crystal test terminals X1, X2 are disposed in a central area on the bottom surface of second recess 20b, where crystal test terminals X1, X2 are electrically connected to a pair of crystal circuit terminals 9a, 9b among circuit terminals 9 through wiring paths 6 on the bottom surface of recess 20b. At the positions of crystal test terminals X1, X2, via-holes 8a, 8b are formed as electrode through-holes so as to extend through second layer B. Via-holes 8a, 8b are electrically connected directly to crystal test terminals X1, X2, respectively.

Crystal blank 2, which comprises, for example, a substantially rectangular AT-cut quartz crystal blank, is formed with excitation electrodes on both main surfaces thereof, respectively. From a pair of excitation electrodes, lead-out electrodes are extended toward both ends of one side of crystal blank 2, respectively. A pair of crystal holding terminals 4a, 4b are disposed on the bottom surface of first recess 20a, i.e., on the surface of first layer A. Crystal blank 2 is secured to and held in first recess 20a by securing these lead-out electrodes to crystal holding terminals 4a, 4b, for example, with conductive adhesive 11 at the positions from which the pair of lead-out electrodes are drawn.

A metal ring or metal thick film, not shown, is formed on the upper surface of frame layer 1b, such that metal cover 12 is bonded to this metal ring or the like to close first recess 20a, thereby hermetically sealing crystal blank 2 in first recess 20a. In this connection, metal cover 12 is electrically connected to the ground terminal among mounting electrodes 10 through a conductive path such as a via-hole, not shown.

On the upper surface of first layer A in substantially rectangular central layer 1a, the aforementioned crystal holding terminals 4a, 4b are disposed respectively in close proximity to both ends of one short side of first layer A, as illustrated in FIG. 2A. Via-holes 5a, 5b are also formed through first layer A in close proximity to the centers of both short sides of first layer A, respectively, as electrode through-holes. Crystal holding terminals 4a, 4b are electrically connected to via-holes 5a, 5b, respectively, through wiring paths 6 formed on the upper surface of first layer A.

FIG. 2B is a plan view illustrating the surface of second layer B which opposes first layer A, showing the layout of a conductor pattern on a laminated surface of second layer B with first layer A. As illustrated, shield electrode 7 is disposed substantially across the entire laminated surface of second layer B with first layer A. The entire outer periphery of shield electrode 7 extends to positions at which frame layers 1b, 1c are formed, with the result that shield electrode 7 extends substantially below the entirety of first and second recesses 20a, 20b. Shield electrode 7 is partially cut out in a central area thereof, where a wiring path 6 is formed for connecting via-hole 5a to via-hole 8a, and another wiring path 6 is formed for connecting via-hole 5b to via-hole 8b. These via-holes 5a, 5b, 8a, 8b and wiring paths 6 are electrically independent of shield electrode 7. Shield electrode 7 is electrically connected to the ground terminal among mounting electrodes 10 through a conductive path such as a via-hole, not shown.

IC chip 3, which is substantially rectangular in shape, has an oscillation circuit using crystal blank 2 integrated on a semiconductor substrate. In addition to the oscillation circuit, a temperature compensation mechanism may be integrated on IC chip 3 for compensating crystal blank 2 for frequency-temperature characteristics. Since the oscillation circuit and the like are formed on one main surface of the semiconductor substrate through a general semiconductor device fabricating process, a circuit forming surface will refer to one of the two main surfaces of IC chip 3 on which the oscillator circuit and the like are formed. A plurality of IC terminals are disposed on the circuit forming surface along both long sides thereof. The IC terminals correspond to circuit terminals 9, 9a, 9b which are disposed on the lower surface of second layer B in central layer 1a, and are electrically connected to a circuit in IC chip 3. IC terminals include a pair of crystal connection terminals corresponding to crystal circuit terminals 9a, 9b, a power supply terminal, an output terminal, a ground terminal, and an AFC terminal, and further include write terminals for writing temperature compensation data into a temperature compensation mechanism in the case of a temperature compensated crystal oscillator. IC chip 3 is secured to the bottom surface of second recess 20b by bonding its IC terminals to circuit terminals 9, 9a, 9b disposed on the bottom surface of second recess 20b through ultrasonic thermo-compression bonding using bumps 13 by a so-called flip-chip bonding approach. Terminals corresponding to the write terminals, among circuit terminals 9, are electrically connected to write surface terminals 14 disposed on the outer side surface of package body 1 through conductive paths, not shown.

In this crystal oscillator, crystal holding terminals 4a, 4b are electrically connected to crystal test terminals X1, X2, respectively, through crank-shaped conductive paths including via-holes 5a, 5b, 8a, 8b formed at different positions of first layer A and second layer B in the central layer, and wiring paths 6 routed on the laminated surface of second layer B with first layer A. In this configuration, leaky hermetic sealing is prevented to ensure that first recess 20a is hermetically sealed, as compared with electrode through-holes which are formed through first layer A and second layer B by creating via-holes at the same positions of these layers. In addition, crystal blank 2 is prevented from being electrically coupled to IC chip 3 by shield electrode 7 formed on the laminated surface of first layer A with second layer B, thus maintaining good oscillation characteristics. Via-holes 5a, 5b, 8a, 8b are formed at positions at which they are covered with IC chip 3 when it is secured to second recess 20b.

It should noted that crystal test terminals X1, X2 are provided for measuring oscillation characteristics of crystal blank 2 alone, for example, a crystal impedance (CI) and the like, as a crystal element, after crystal blank 2 is covered with metal cover 12 for hermetic sealing and before IC chip 3 is mounted in a crystal oscillator manufacturing process. By measuring the oscillation characteristics of crystal blank 2 before IC chip 3 is mounted, defective items can be eliminated to prevent defective oscillations after shipment caused by the crystal element.

After IC chip 3 has been secured to second recess 20b in the aforementioned manner, a protective resin is generally coated on second recess 20b as a so-called under fill for protecting the circuit forming surface of IC chip 3.

However, the surface mount type crystal oscillator configured as described above has a problem of defective connections of IC chip 3 with circuit terminals 9, 9a, 9b through bumps 13, caused by via-holes 5a, 5b, 8a, 8b formed electrically independently of shield electrode 7 in a central area of the laminated surface of second layer B with first layer A, on which shield electrode 7 is disposed, i.e., an area which is to be covered with IC chip 3.

Package body 1 is formed by laminating unburned ceramic sheets (green ceramic sheets), which are to be first layer A, second layer B and frame layers 1b, 1c, respectively, and burning these layers together. In this event, for forming circuit patterns including shield electrode 7 and via-holes 5a, 5b, 8a, 8b, conductor patterns of tungsten (W) or molybdenum (Mo) are printed as underlying electrodes on the unburned ceramic sheets before they are laminated, and after laminating and burning, a nickel (Ni) layer and a gold (Au) layer, for example, are sequentially formed following the conductor pattern by plating. However, the conductor pattern formed on the laminated surface of second layer B with first layer A is not plated and is therefore comprised only of the underlying electrode.

In this event, as illustrated in FIG. 3A, shield electrode 7 and via-holes 5a, 5b are formed separately from each other on the upper surface of first layer A in central layer 1a, resulting in an area between them in which no conductor pattern is formed. If second layer B is laminated on first layer A in such a situation, the surface of second layer B becomes curved due to outer peripheral electrodes P of via-holes 5a, 5b (and via-holes 8a, 8b) and shield electrode 7, which cause ruggedness equal to their thicknesses. It should be noted that FIG. 3A is drawn upside down with respect to FIG. 1A for the sake of description. Since the electrodes have thicknesses, for example, in a range of approximately 10 to 15 μm, level difference d due to the ruggedness formed on the surface of second layer B is equal to or larger than such thicknesses.

Thus, due to the ruggedness of second layer B which constitutes the bottom surface of the recess on which IC chip 3 is to be secured, as illustrated in FIG. 3B, bumps 13 may not be sufficiently compression-bonded to possibly cause defective connections at locations where the ruggedness create large gaps between second layer B and IC chip 3, when IC chip 3 is secured through thermo-compression bonding. For reference, the bottom surface of the recess is required to exhibit a flatness of 10 to 15 μm, which is similar to the thickness of the electrodes, during the thermo-compression bonding.

SUMMARY OF THE INVENTION

It is an object of the present invention to provide a surface mount type crystal oscillator which ensures the connection of an IC chip through thermo-compression bonding using bumps, and improves the reliability by increasing the flatness of the bottom surface of one of recesses formed in both main surfaces of a package body.

The object of the present invention is achieved by a surface mount type crystal oscillator which comprises a package body comprised of laminated ceramic including a flat central layer, and a first and a second frame layer each having an opening and laminated on one of both surfaces of the central layer, where the central layer is made up of at least a first layer and a second layer laminated one on the other, a crystal blank hermetically sealed in a first recess defined by the first layer and the first frame layer, an IC chip placed in a second recess defined by the central layer and the second frame layer, and having an oscillation circuit using the crystal blank integrated therein, and a shield electrode disposed on a laminated surface of the second layer with the first layer, wherein the crystal blank is electrically connected to the IC chip through a conductive path including at least first electrode through-holes formed through the first layer and second electrode through-holes formed through the second layer, and the first and second electrode through-holes are positioned in areas outside a mounting position of the IC chip on the second recess.

In this configuration, since the first and second electrode through-holes are formed through the first layer and second layer, respectively, outside of the central area in which the IC chip is mounted, the second recess has a flat central area on the bottom surface on which the IC chip should be secured. Accordingly, the IC chip can be connected to circuit terminals disposed on the bottom surface of the second recess without fail through thermo-compression bonding using bumps.

In the present invention, the first and second electrode through-holes may be formed in an area in which the first and second layers are laminated on the central layer. According to this configuration, secure air-tight sealing can be accomplished for the first recess, and the shield electrode exhaustively extends below the entire bottom surfaces of the recesses, thus making it possible to increase a shielding effect.

Also, in the present invention, the first and second electrode through-holes may be formed in alignment with each other. According to this configuration, since no wiring paths are required for connecting the first and second electrode through-holes in lateral directions, the line capacitance, for example, can be reduced to restrain variations in oscillation frequency.

DETAILED DESCRIPTION OF THE PREFERRED EMBODIMENTS

Figure 1A:
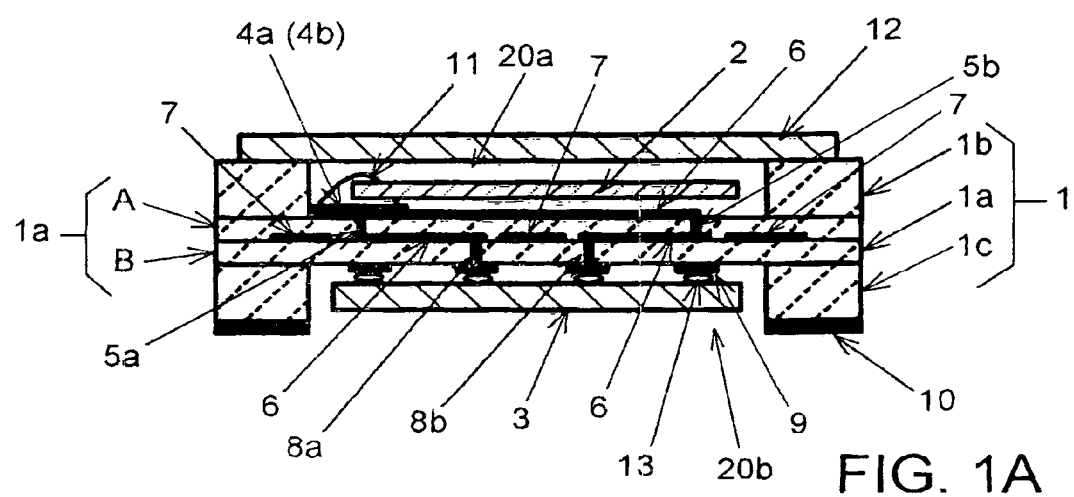
FIG. 1A is a cross-sectional view of a conventional surface mount type crystal oscillator.
Figure 1B:
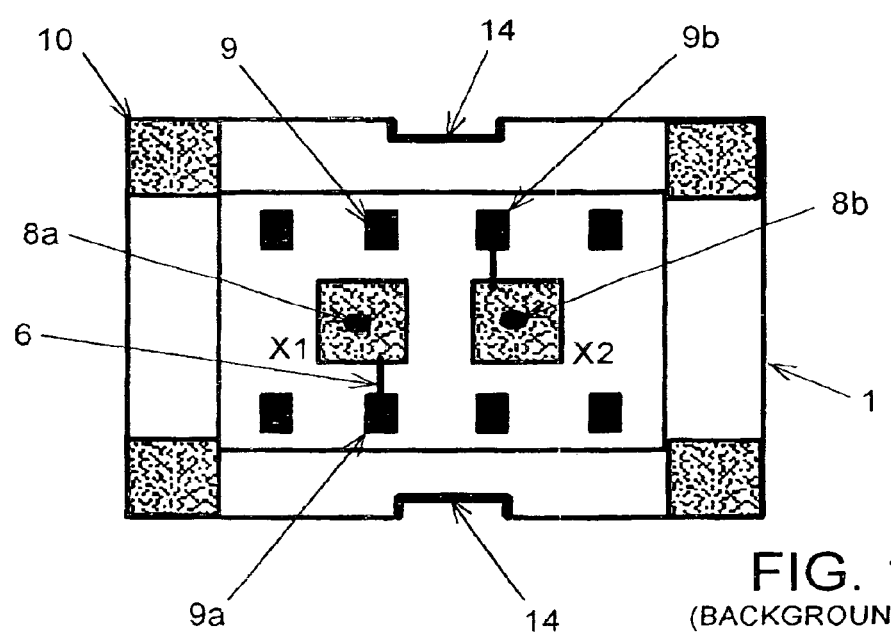
FIG. 1B is a bottom view of the crystal oscillator illustrated in FIG. 1A when no IC chip is mounted therein.
Figure 2A:
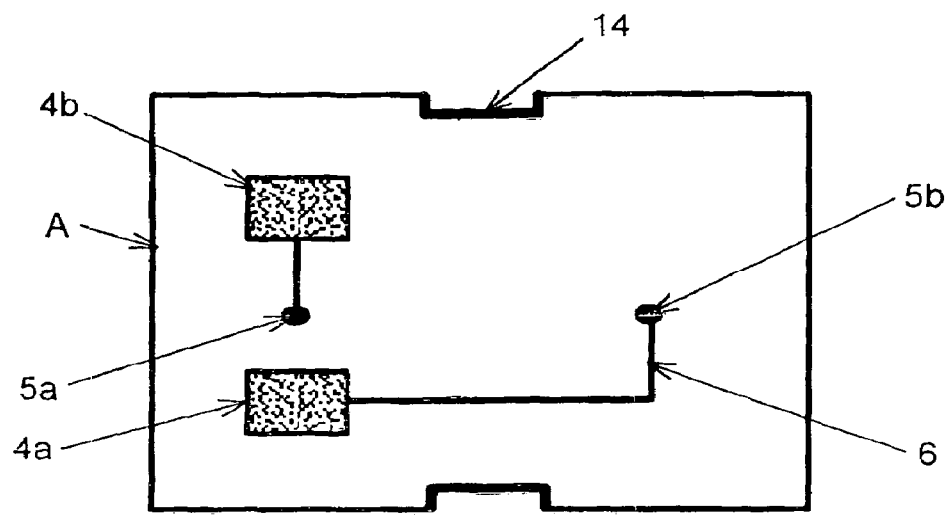
FIGS. 2A and 2B are plan views of a first layer and a second layer in a central layer, respectively, in the crystal oscillator illustrated in FIG. 1A.
Figure 2B:
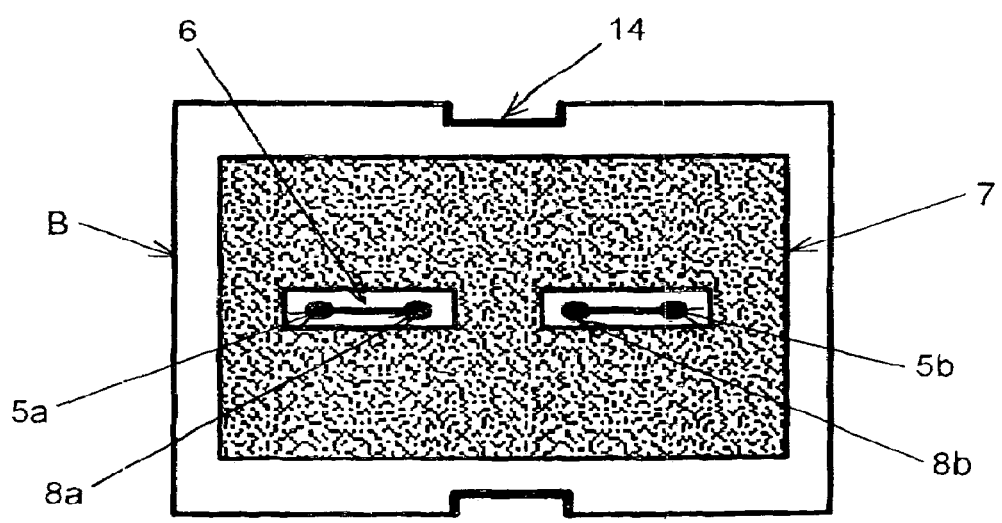
Figure 3A:
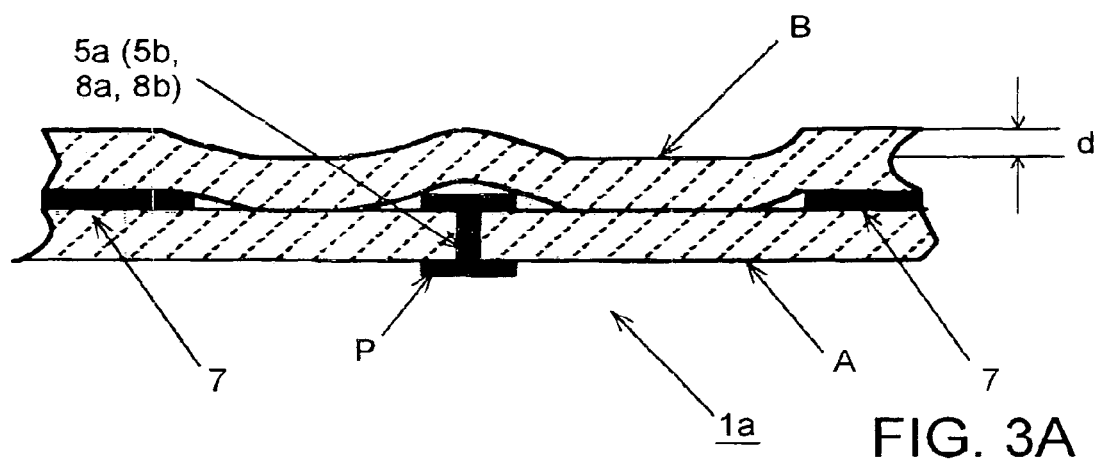
FIG. 3A is a partial cross-sectional view of the central layer.
Figure 3B:
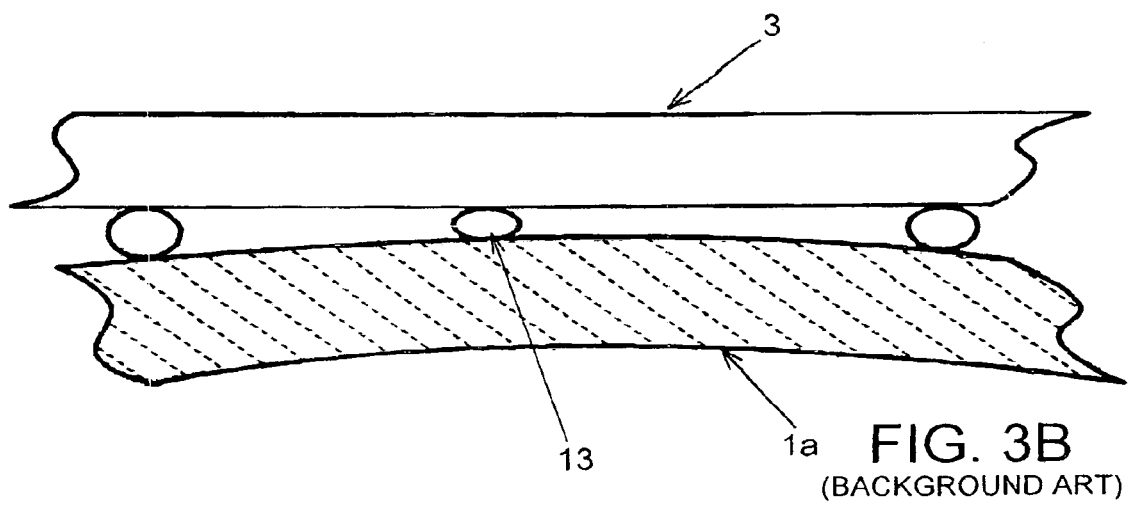
FIG. 3B is a partial cross-sectional view of the central layer when an IC chip is mounted.

FIGS. 4A, 4B, 5A, and 5B illustrate a surface mount type crystal oscillator according to one embodiment of the present invention. In the following description, the same components as those in the aforementioned FIGS. 1A, 1B, 2A, 2B, 3A, and 3B are designated the same reference numerals.

Figure 4A:
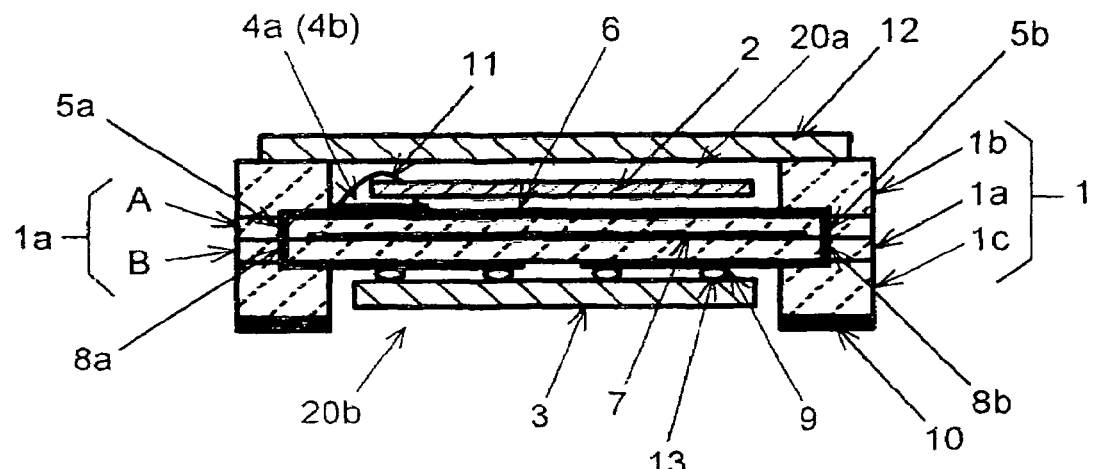
FIG. 4A is a cross-sectional view of a surface mount type crystal oscillator according to one embodiment of the present invention.
Figure 4B:
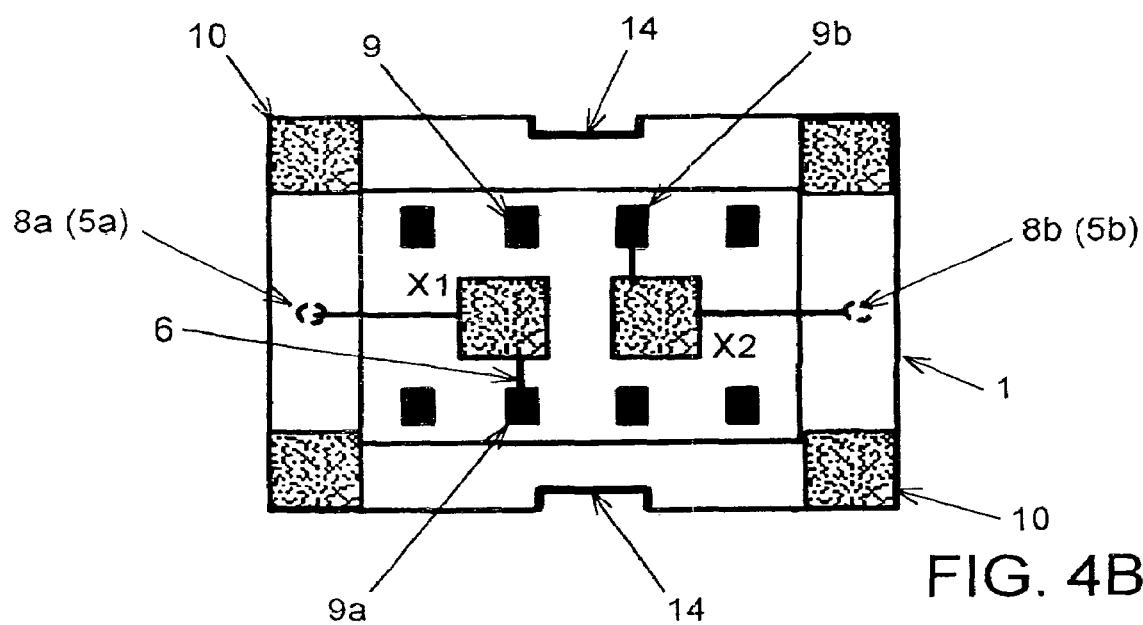
FIG. 4B is a bottom view of the crystal oscillator illustrated in FIG. 4A when no IC chip is mounted therein.
Figure 5A:
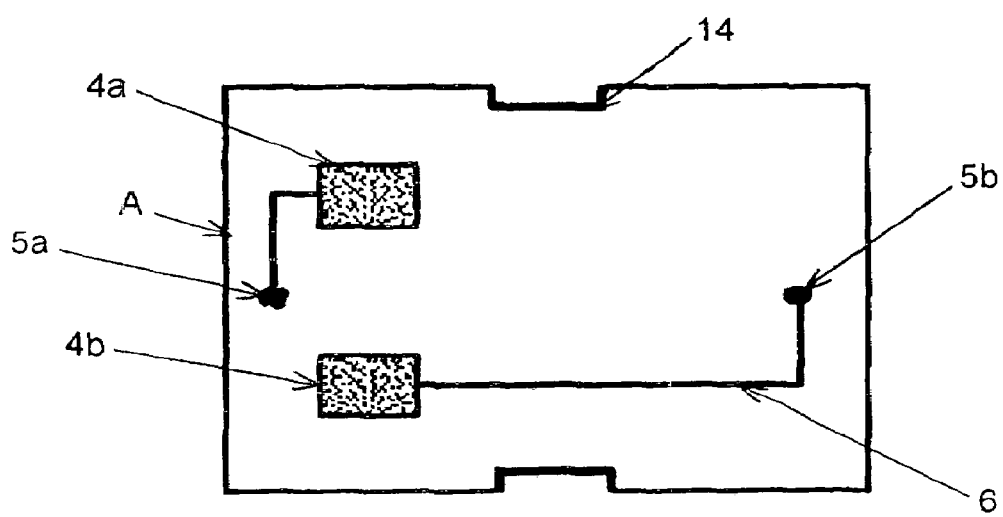
FIGS. 5A and 5B are plan views of a first layer and a second layer in a central layer, respectively, in the crystal oscillator illustrated in FIG. 4A.
Figure 5B:
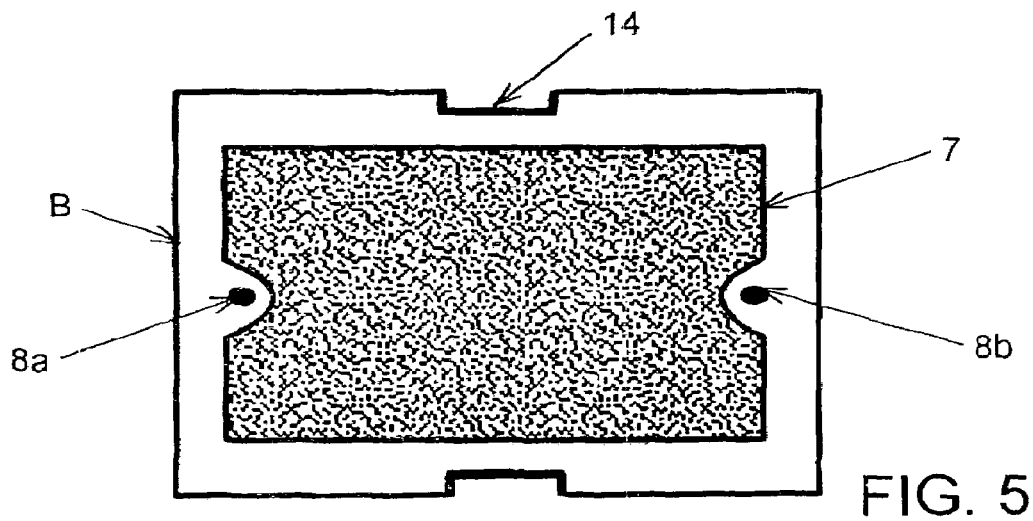

The quartz crystal oscillator of this embodiment, which is similar to the aforementioned conventional one, comprises package body 1 formed with recesses 20a, 20b respectively in both main surfaces thereof; quartz crystal blank 2 hermetically sealed in first recess 20a; and IC (integrated circuit) chip 3 secured to the bottom surface of second recess 20b through ultrasonic thermo-compression bonding using bumps 13, as illustrated in FIG. 4A. Package body 1 is formed of laminated ceramic which includes central layer 1a comprised of first layer A and second layer B laminated on first layer A, and first and second frame layers 1b, 1c, each having an opening and laminated on one or the other surface of central layer 1a. First recess 20a is defined by central layer 1a and first frame layer 1b, while second recess 20b is defined by central layer 1a and second frame layer 1c. Mounting electrodes 10 are formed respectively at four corners of second frame layer 1c, as illustrated in FIG. 4B.

The crystal oscillator of this embodiment differs from the crystal oscillator illustrated in FIGS. 1A, 1B, 2A, and 2B in the positions at which via-holes 5a, 5b are formed as electrode through-holes which extend through first layer A, and the positions at which via-holes 8a, 8b are formed as electrode through-holes which extend through second layer B. Then, shield electrode 7, formed on an laminated surface of second layer B with first layer A is uniformly formed without having any cutout at least in an area which extend below recesses 20a, 20b. In other words, shield electrode 7 is formed below the bottom surfaces of recesses 20a, 20b to exhaustively extend over the entire areas of the bottom surfaces.

A pair of crystal holding terminals 4a, 4b are disposed on the upper surface of first layer A of central layer 1a, as described above. Via-holes 5a, 5b are electrically connected to crystal holding terminals 4a, 4b, respectively, through wiring path 6 routed on the upper surface of first layer A. Via-holes 5a, 5b extend through first layer A at positions near both ends of central layer 1a in the longitudinal direction of central layer 1a. Specifically, via-holes 5a, 5b are formed in an area in which frame layer 1b is laminated on central layer 1a. Via-holes 8a, 8b, which extend through second layer B, are formed in an area in which frame layer 1c is laminated on central layer 1a at the same positions at which via-holes 5a, 5b are formed. As a result, via-holes 5a, 5b and via-holes 8a, 8b are arranged in alignment with each other, such that they stand in the vertical direction in FIG. 4A. Associated with via-holes 5a, 5b, 8a, 8b thus positioned, shield electrode 7 is formed with arcuate cutouts in both longitudinal end areas in order to make the via holes electrically independent of shield electrode 7. The cutouts are positioned within the area in which frame layers 1b, 1c are laminated on central layer 1a, but do not extend to positions which fall within the bottom surfaces of recesses 20a, 20b.

Via-holes 8a, 8b have other ends electrically connected to crystal test terminals X1, X2, respectively, positioned in a central area on the lower surface of second layer B through wiring path 6 routed on the lower surface of second layer B. Crystal test terminals X1, X2 are electrically connected to crystal circuit terminals 9a, 9b, respectively, among circuit terminals 9, in a manner similar to the foregoing.

In the crystal oscillator described above, package body 1 is fabricated by forming via-holes 5a, 5b, 8a, 8b through unburned ceramic sheets, which later serve as first layer A and second layer B of central layer 1a, respectively, together with other circuit patterns, subsequently laminating unburned ceramic sheets including those of frame layers 1b, 1c, and burning the resulting laminate together. In this event, even if through-holes for the via-holes slightly shift in position, the outer peripheral electrodes of via-holes 5a, 5b connect to the outer peripheral electrodes of via-holes 8a, 8b to ensure electric connections therebetween, as appreciated.

Via-holes as electrode through-holes are formed by filling the through-holes with a printing material when a circuit underlying pattern is formed by printing. The printing material is made, for example, of molybdenum (Mo) or tungsten (W). Then, after burning the printing material together with the ceramic sheets, the via-holes are completed by laminating a nickel (Ni) layer and a gold (Au) layer on the circuit pattern, for example, by plating. Through such a process, the through-holes formed through the ceramic sheets are closed to maintain air-tight sealing of first recess 20a. In this connection, in this embodiment, nickel (Ni) or gold (Au) is not plated on the circuit pattern formed on the laminated surface of second layer B with first layer A.

In the configuration described above, via-holes 5a, 5b, 8a, 8b are positioned in an area which is located in outer peripheral zones of first layer A and second layer B, where frame layers 1b, 1c are laminated on central layer 1a. On the other hand, shield electrode 7 is uniformly formed on the surface of second layer B which is to be laminated on first layer A to exhaustively cover the entire bottom surfaces of the recesses. Consequently, first layer A and second layer B, which fall within the bottom surfaces of recesses 20a, 20b, are both made flat when the ceramic sheets are laminated, and maintain the flatness without ruggedness even after they are laminated and burned. In this way, since IC chip 3 is mounted on a flat central area of the bottom surface of second recess 20b, IC chip 3 can be connected to circuit terminals 9 without fail when IC chip 3 is secured through ultrasonic thermo-compression bonding using bumps 13.

In this crystal oscillator, since shield electrode 7 is seamlessly disposed in correspondence to the entire bottom surfaces of the recesses, the shielding effect can be increased between crystal blank 2 and IC chip 3. On the other hand, in the conventional crystal oscillator illustrated in FIGS. 1A, 1B, 2A, and 2B, the shield electrode must be formed with cutouts in order to form the via-holes in the central area and route wiring paths between the via-holes, possibly causing a loss of shielding.

Also, in the crystal oscillator of this embodiment, since the via-holes of first layer A are electrically connected directly to the via-holes of second layer B such that they are arranged in alignment with each other, unnecessary wiring paths can be eliminated to thereby reduce the line capacitance.

In the foregoing description, via-holes 8a, 8b are directly connected to crystal test terminals X1, X2, but alternatively, via-holes 8a, 8b may be connected to crystal test terminals X1, X2 by way of crystal circuit terminals 9a, 9b.

Via-holes 5a, 5b and via-holes 8a, 8b need not be necessarily formed in alignment with each other, but they may differ in position as long as the different positions fall within the area in which frame layers 1b, 1c are laminated on central layer 1a. Moreover, via-holes 5a, 5b which extend through first layer A, and via-holes 8a, 8b which extend through second layer B are not limited to the positions defined above, but similar advantages to the foregoing can be provided when they are positioned outside of the central area on the bottom surface of second recess 20b, on which IC chip 3 is mounted.

Figure 6A:
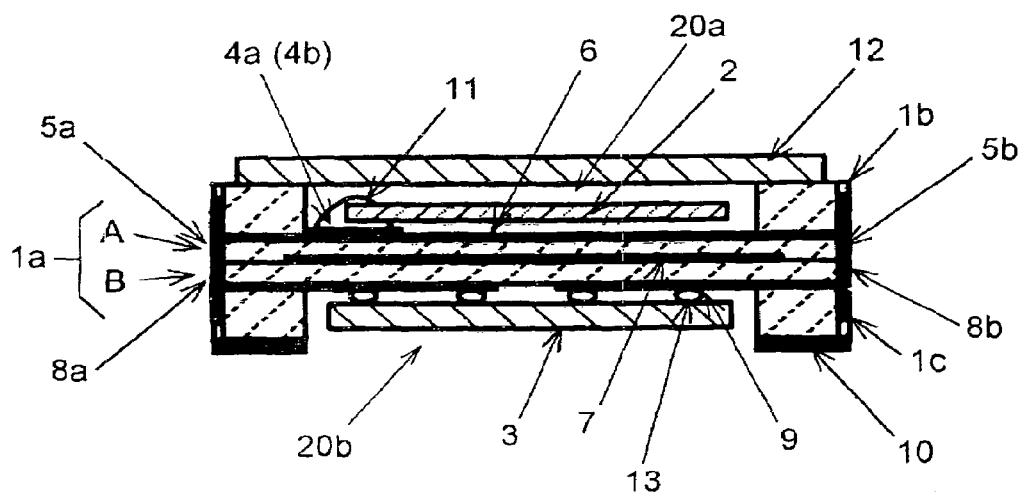
FIG. 6A is a cross-sectional view of a surface mount type crystal oscillator according to another embodiment of the present invention.
Figure 6B:
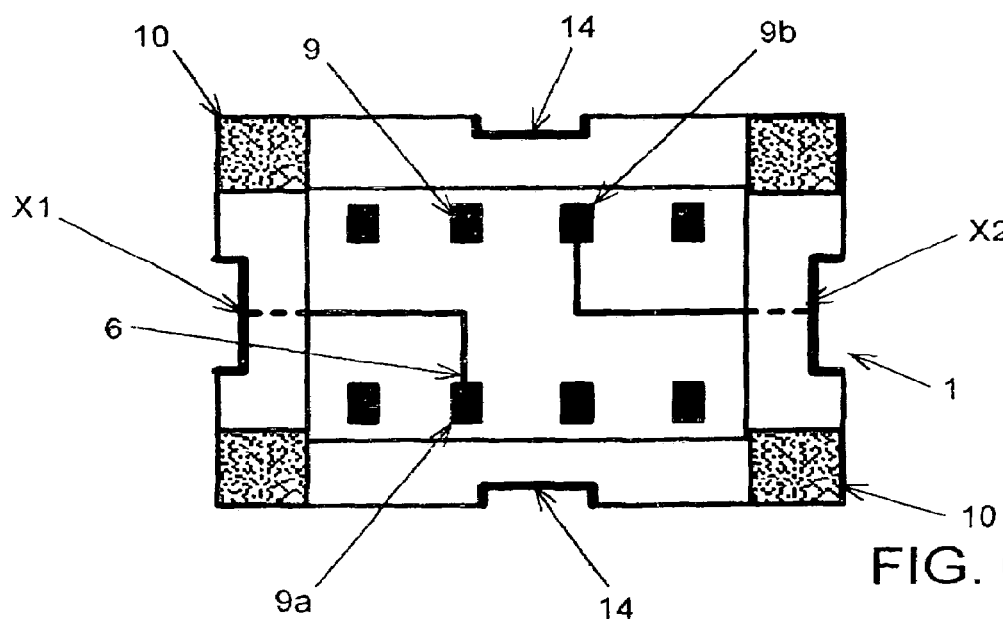
FIG. 6B is a bottom view of a crystal oscillator illustrated in FIG. 6A when no IC chip is mounted therein.

In the crystal oscillator described above, while a pair of crystal test terminals X1, X2 are disposed on the bottom surface of second recess 20b, the crystal-test terminals are not limited to such positioning. For example, crystal test terminals X1, X2 may be disposed on the outer side surface of package body 1, as illustrated in FIGS. 6A and 6B. In this event, crystal test terminals X1, X2 have been disposed on both end faces of central layer 1a (i.e., first layer A and second layer B) by through-hole processing, and wiring paths 6 are extended from crystal holding terminals 4a, 4b to both end sides of first layer A on the upper surface of first layer A, and connected to crystal test terminals X1, X2. Likewise, on the lower surface of second layer B, wiring paths 6 are extended from a pair of crystal circuit terminals 9a, 9b in circuit terminals 9 to both end sides of second layer B, and connected to crystal test terminals X1, X2. In such a configuration, crystal test terminals X1, X2 are provided as electrode through-holes which are formed by performing through-hole processing in the unburned ceramic sheets. However, in the through-hole processing for forming the crystal test terminals, the printing material is coated only on the inner peripheral surface without filling the through-holes with the printing material. In this event, Ni and Au are plated on the surfaces of the through-hole which constitute crystal test terminals X1, X2. In this respect, the crystal test terminals in the crystal oscillator illustrated in FIGS. 6A and 6B are different from via-holes.

In the foregoing configuration, no crystal test terminals are needed on the bottom surface of second recess 20b, so that the crystal oscillator can be correspondingly reduced in size.

While the foregoing description has been made in connection with a surface mount type crystal oscillator which is of a temperature compensated type, the present invention can also be applied to a simple packaged crystal oscillator which is used as a general clock oscillator. Also, while the surface mount type crystal oscillator has crystal test terminals X1, X2, the present invention can also be applied to surface mount type crystal oscillators which do not have crystal test terminals.

What is claimed is:

1. A surface mount crystal oscillator comprising:
    a package body comprised of laminated ceramic including a flat central layer, and a first and a second frame layer each having an opening and laminated on one of both surfaces of said central layer, said central including at least a first layer and a second layer laminated one on other; a crystal blank hermetically sealed in a first recess defined by said first layer and said first frame layer; an IC chip placed in a second recess defined by said central layer and said second frame layer, and having an oscillation circuit using said crystal blank integrated therein, and a shield electrode disposed on a laminated surface of said second layer with said first layer;
    a pair of crystal test terminals formed on an end face of said central layer; and
    conductive paths electrically connecting said crystal to said IC chip through crystal test terminals,
    wherein said conductive paths pass a laminated surface of said central layer with said first frame layer and a laminated surface of said central layer with said second flame layer.

2. The crystal oscillator according to claim 1, wherein said IC chip is secured to a bottom surface of said second recess through ultrasonic thermo-compression bonding using bumps.

3. The crystal oscillator according to claim 1, wherein said pair of crystal test terminals is formed on opposite end faces of the central layer.

4. The crystal oscillator according to claim 1, further comprising:
    a pair of crystal holding terminals formed on the central layer such that said crystal holding terminals are disposed on an inner bottom surface of said first recess; and a pair of crystal circuit terminals formed on the central layer such that said crystal circuit terminals are disposed on an inner bottom surface of said second recess, wherein said crystal blank is mechanically and electrically secured to the crystal holding terminals and the IC chip is mechanically and electrically secured to the crystal circuit terminals, and said conductive paths are connected between said crystal holding terminals and said crystal circuit terminals.

wherein said IC chip is secured to a bottom surface of said second recess through ultrasonic thermo-compression bonding using bumps.

5. The crystal oscillator according to claim 4, wherein said pair of crystal test terminals is formed on opposite end faces of the central layer.

* * * * *